(12) United States Patent
Ly-Gagnon et al.

(10) Patent No.: US 9,100,243 B2
(45) Date of Patent: Aug. 4, 2015

(54) DYNAMIC LOW-IF FREQUENCY FOR INTERFERENCE MITIGATION

(71) Applicant: QUALCOMM Incorporated, San Diego, CA (US)

(72) Inventors: Yann Ly-Gagnon, San Jose, CA (US); Paul Husted, San Jose, CA (US)

(73) Assignee: Qualcomm Incorporated, San Diego, CA (US)

( * ) Notice: Subject to any disclaimer, the term of this patent is extended or adjusted under 35 U.S.C. 154(b) by 50 days.

(21) Appl. No.: 13/924,243

(22) Filed: Jun. 21, 2013

(65) Prior Publication Data

US 2014/0270019 A1 Sep. 18, 2014

Related U.S. Application Data

(60) Provisional application No. 61/799,569, filed on Mar. 15, 2013.

(51) Int. Cl.
| | |
|---|---|
| *H03D 7/18* | (2006.01) |
| *H04L 27/06* | (2006.01) |
| *H04B 1/30* | (2006.01) |
| *H04L 27/38* | (2006.01) |
| *H03D 1/04* | (2006.01) |
| *H03D 7/16* | (2006.01) |
| *H04B 1/10* | (2006.01) |

(52) U.S. Cl.
CPC ............... *H04L 27/063* (2013.01); *H03D 1/04* (2013.01); *H03D 7/165* (2013.01); *H03D 7/18* (2013.01); *H04B 1/30* (2013.01); *H04L 27/3863* (2013.01); *H04B 2001/1072* (2013.01)

(58) Field of Classification Search
CPC ........................................................ H03D 7/18
USPC ................................................... 375/346, 316
See application file for complete search history.

(56) References Cited

U.S. PATENT DOCUMENTS

| | | | |
|---|---|---|---|
| 5,802,463 A | 9/1998 | Zuckerman | |
| 7,551,910 B2 | 6/2009 | Darabi | |
| 7,593,491 B1 | 9/2009 | Khlat et al. | |
| 7,873,342 B2 | 1/2011 | Lim et al. | |
| 8,102,943 B1 * | 1/2012 | Khlat et al. | 375/316 |
| 8,279,974 B1 | 10/2012 | Husted et al. | |
| 2003/0068995 A1 * | 4/2003 | Louis et al. | 455/313 |
| 2007/0171919 A1 | 7/2007 | Godman et al. | |
| 2010/0232490 A1 * | 9/2010 | Balakrishnan et al. | 375/227 |
| 2011/0171919 A1 | 7/2011 | Tryhub et al. | |

OTHER PUBLICATIONS

International Search Report and Written Opinion—PCT/US2014/021386—ISA/EPO—Jun. 13, 2014.

* cited by examiner

*Primary Examiner* — Michael Neff
(74) *Attorney, Agent, or Firm* — Mahamedi Paradice LLP

(57) ABSTRACT

A method of operating a receiver in a communications system is disclosed. The receiver receives a radio-frequency (RF) data signal and converts the RF data signal to an intermediate frequency. The receiver then determines whether a blocker image interferes with the received data signal, and selectively adjusts the intermediate frequency to which the data signal is converted based on the determination. The receiver may lower the intermediate frequency if the blocker image interferes with the received data signal. The receiver may also deactivate a quadrature chain of the receiver if the blocker image interferes with the received data signal.

37 Claims, 12 Drawing Sheets

DYNAMIC LOW-IF FREQUENCY FOR INTERFERENCE MITIGATION

CROSS-REFERENCE TO RELATED APPLICATIONS

This application claims priority to U.S. Provisional Patent Application No. 61/799,569, titled "Dynamic Low-IF Frequency for Interference Mitigation," filed Mar. 15, 2013, which is hereby incorporated by reference in its entirety.

TECHNICAL FIELD

The present embodiments relate generally to communications systems, and specifically to dynamically adjusting a low-intermediate frequency (Low-IF) used to receive radio frequency (RF) signals.

BACKGROUND OF RELATED ART

Heterodyne receivers convert received signals from the frequency at which they are received to an intermediate frequency (IF) by mixing the received signals with signals generated by a local oscillator. Such receivers are distinguishable from direct-conversion receivers, which convert the received signals directly to baseband. Superheterodyne receivers initially convert the received signals to a low-intermediate frequency (Low-IF) before converting the signals to baseband.

Heterodyne (and Superheterodyne) receivers are sensitive to various signal impairments that affect the quality of the received signals. Signal impairments may result from non-idealities in the RF front-ends of the receivers. For example, mismatched active and passive elements (e.g., quadrature mixers, filters, and/or analog-to-digital converters) in the I and Q (in-phase and quadrature) signal paths introduce I/Q mismatch impairments in transmitted and received signals. Channel effects may also impair signals.

Heterodyne receivers are particularly sensitive to imaging, which causes interference from unwanted frequencies. Specifically, a mixer that converts a desired frequency to IF simultaneously converts an undesired frequency to the same IF (e.g., $f_{desired}=IF+f_{LO}$, where $f_{LO}$ is the local oscillator frequency; $f_{undesired}=IF-f_{LO}$). For example, a local oscillator signal having a frequency of 200 kHz may be used to convert a desired 700 kHz signal to a 500 kHz IF band signal. However, the local oscillator may also have the effect of converting an undesired 300 kHz signal to the 500 kHz IF band. As a result, any noise or unwanted data carried on the undesired frequency may interfere with the received data signal at the IF band. The undesired frequency is called the "image" of the desired frequency.

SUMMARY

This Summary is provided to introduce in a simplified form a selection of concepts that are further described below in the Detailed Description. This Summary is not intended to identify key features or essential features of the claimed subject matter, nor is it intended to limit the scope of the claimed subject matter.

A device and method of operation are disclosed that may aid in mitigating signal interference in a received data signal. For some embodiments, the device may include a receiver analog front end (AFE) to receive a radio-frequency (RF) data signal and convert the RF data signal to an intermediate frequency; a blocker detector to determine whether a blocker image interferes with the received data signal; and a local oscillator coupled between the blocker detector and the receiver AFE to selectively adjust the intermediate frequency to which the data signal is converted based on the determination. The local oscillator may be configured to lower the intermediate frequency if the blocker image interferes with the received data signal. The device may also include a power controller, coupled between the blocker detector and the receiver AFE, to deactivate a quadrature chain of the receiver AFE if the blocker image interferes with the received data signal.

For some embodiments, the converted data signal may correspond to a digital data signal. The device may further include a transition corrector to selectively apply one or more frequency offsets to the converted data signal based on a settling time of the local oscillator. The settling time of the local oscillator may be compared to a threshold settling time; and the one or more frequency offsets may be applied to the digital data signal if the settling time of the local oscillator exceeds the threshold settling time.

For some embodiments, the blocker detector may be configured to determine a presence of a blocker at a first frequency, wherein the image of the first frequency is within a threshold range of the intermediate frequency. The presence of the blocker may be determined by detecting the blocker at the first frequency. Information identifying the blocker may then be stored in a first table, for example, to enable the blocker detector to subsequently determine whether the blocker image interferes with the received data signal by looking up the blocker in the first table. The presence of the blocker may also be determined by predicting whether the blocker will be present at the first frequency, wherein the prediction may be based on a Markov chain.

By selectively adjusting the intermediate frequency band of the receiver based on the presence of blockers, the present embodiments may substantially reduce (and potentially eliminate) blocker image interference caused by down-converting a received data signal to an intermediate frequency. In addition, the present embodiments may enable the receiver to selectively enter a low power mode, depending on the presence of blockers, without risk of losing data.

BRIEF DESCRIPTION OF THE DRAWINGS

The present embodiments are illustrated by way of example and are not intended to be limited by the figures of the accompanying drawings, where.

DETAILED DESCRIPTION

In the following description, numerous specific details are set forth such as examples of specific components, circuits, and processes to provide a thorough understanding of the present disclosure. The term "coupled" as used herein means connected directly to or connected through one or more intervening components or circuits. Also, in the following description and for purposes of explanation, specific nomenclature is set forth to provide a thorough understanding of the present embodiments. However, it will be apparent to one skilled in the art that these specific details may not be required to practice the present embodiments. In other instances, well-known circuits and devices are shown in block diagram form to avoid obscuring the present disclosure. Any of the signals provided over various buses described herein may be time-multiplexed with other signals and provided over one or more common buses. Additionally, the interconnection between circuit elements or software blocks may be shown as buses or as single signal lines. Each of the buses may alternatively be a single signal line, and each of the single signal lines may alternatively be buses, and a single line or bus might represent any one or more of a myriad of physical or logical mechanisms for communication between components. The present embodiments are not to be construed as limited to specific examples described herein but rather to include within their scope all embodiments defined by the appended claims. As used herein, the terms "dynamic" and "dynamically" refer to controlling or regulating characteristics of a device without explicit operator intervention (e.g., an explicit user command to change a power characteristic).

Figure 1:
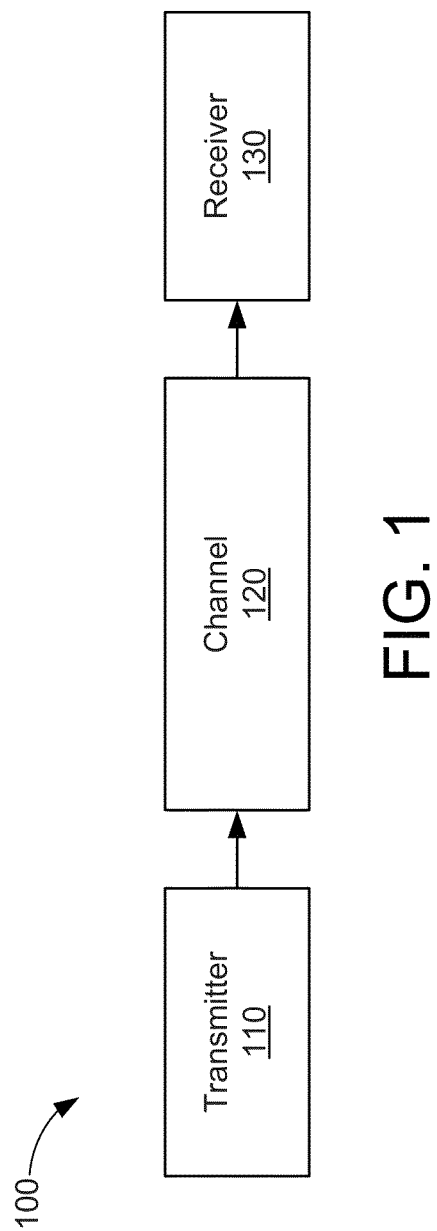
FIG. 1 shows a communications system in accordance with some embodiments.

FIG. 1 shows a communications system 100 in accordance with some embodiments. A transmitter 110 transmits a signal onto a channel 120, and a receiver 130 receives the signal from the channel 120. The transmitter 110 and receiver 130 may be, for example, computers, switches, routers, hubs, gateways, and/or similar devices. For some embodiments, the communications system 100 is wireless. For other embodiments, the channel 120 may be a wired link (e.g., a coaxial cable or other physical connection).

Imperfections of various components in the communications system 100 may become sources of signal impairment, and thus cause signal degradation. Specifically, a wireless signal transmitted by the transmitter 110 may be affected by an interfering signal (e.g., a "blocker") present in the channel 120. To combat potential interference from blockers, the receiver 130 may be configured to detect the presence of a blocker in the channel 120 and dynamically adjust the IF band of the receiver 130 based on whether or not a blocker is present.

Figure 2A:
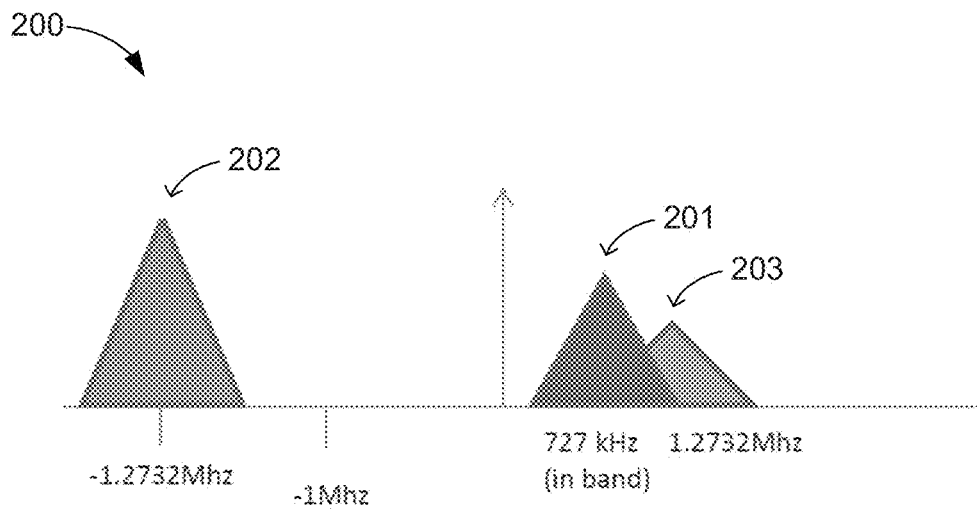
FIGS. 2A-2B illustrate a dynamic IF adjustment in accordance with some embodiments.

For example, the Bluetooth specification defines a −2 MHz blocker requirement. Thus, in order to comply with the Bluetooth specification, a communications system (particularly a receiver) should be able to tolerate a blocker that is −2 MHz away from the IF band. As shown in the exemplary frequency graph 200 of FIG. 2A, a received data signal 201 is centered at the 727 kHz IF band and a blocker 202 is centered at −2 MHz+727 kHz=−1.273 MHz. A blocker image 203 is therefore centered at −1*(−2 MHz+727 kHz)=1.273 MHz. Because the center frequency of the blocker image 203 is in relatively close proximity to the IF band (e.g., 546 kHz separation), at least a portion of the blocker image 203 overlaps with the received data signal 201. This may contribute to noise (~10 dB) in the received data signal 201.

The noise caused by a blocker image may be mitigated and/or eliminated by adjusting the IF band. For example, moving the IF band 1 kHz closer to baseband may cause the blocker image to shift 2 kHz in the opposite direction. As shown in the exemplary frequency graph 250 of FIG. 2B, moving the data signal 201 to the 500 kHz IF band (e.g., from 727 kHz) causes the blocker 202 to be centered at −2 MHz+500 kHz=−1.5 MHz. The blocker image 203 is now centered at −1*(−2 MHz+500 kHz)=1.5 MHz, thus resulting in significantly greater frequency separation with the IF band (e.g., 1 MHz separation). As a result, the blocker image 203 no longer overlaps with the received data signal 201, and can thus be easily filtered out (e.g., using low-pass or band-pass filtering techniques).

Figure 3:
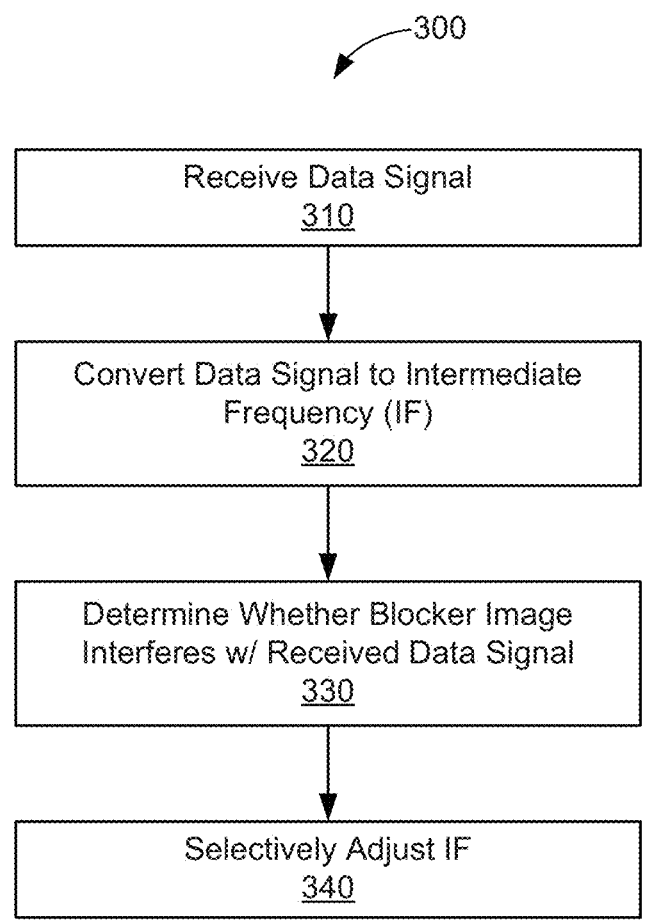
FIG. 3 is an illustrative flow chart depicting a dynamic IF adjustment operation in accordance with some embodiments.

FIG. 3 is an illustrative flow chart depicting a dynamic IF operation 300 in accordance with some embodiments. With reference, for example, to FIG. 1, the receiver 130 first receives a data signal from the transmitter 110, via the communications channel 120 (310). For some embodiments, the channel 120 is a wireless communications channel. For example, the data signal may be modulated on a radio-frequency (RF) carrier signal (e.g., 2.4 GHz).

The receiver 130 then converts the received data signal to an intermediate frequency (320). For example, if the data signal is transmitted at RF, the receiver 130 may down-convert the RF signal to an IF that is closer to baseband (e.g., a Low-IF). For some embodiments, the receiver 130 may convert the received data signal by mixing the data signal with a local oscillator signal.

The receiver 130 further determines whether a blocker image interferes with the received data signal (330). For some embodiments, the receiver may scan the frequency band(s) having image frequencies close to IF for the presence of a blocker. For example, with reference to FIG. 2A, where IF=727 kHz, the receiver 130 may detect whether a blocker exists in the −1.273 MHz frequency band.

Figure 2B:
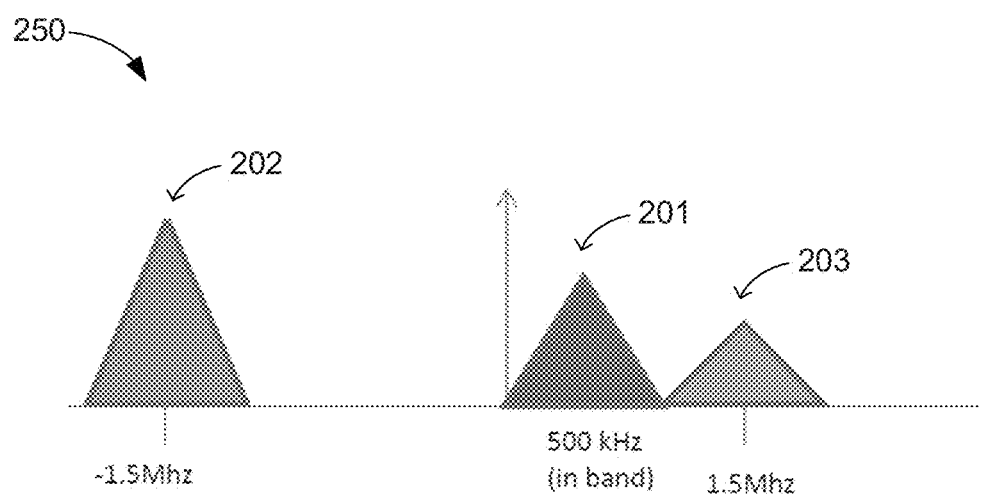

Finally, the receiver 130 selectively adjusts the IF based on the determination (340). For some embodiments, the receiver 130 may determine whether to adjust the IF based in part on the current IF. For example, with reference to FIG. 2A, if a blocker 202 is detected at −1.273 MHz, then it may be assumed that the blocker image 203 will overlap with the 727 kHz IF band. Thus, the receiver 130 may reduce the IF (e.g., to 500 kHz) to increase the separation between the blocker image 203 and the received data signal 201, as shown in FIG. 2B. For some embodiments, the receiver 130 may reduce the IF to a frequency where there is minimal or no overlap between the received data signal 201 and the blocker image 203. Further, for some embodiments, the receiver 130 may adjust the IF only if the blocker interference is relatively strong (e.g., equal or greater in power) compared to the received data signal.

By selectively adjusting the IF band of the receiver 130 based on the presence of blockers, the dynamic IF adjustment operation 300 may substantially reduce (and potentially eliminate) blocker image interference caused by down-converting a received data signal to IF. This, in turn, allows for more relaxed I/O imbalance calibration requirements throughout the rest of the receiver 130.

Figure 4:
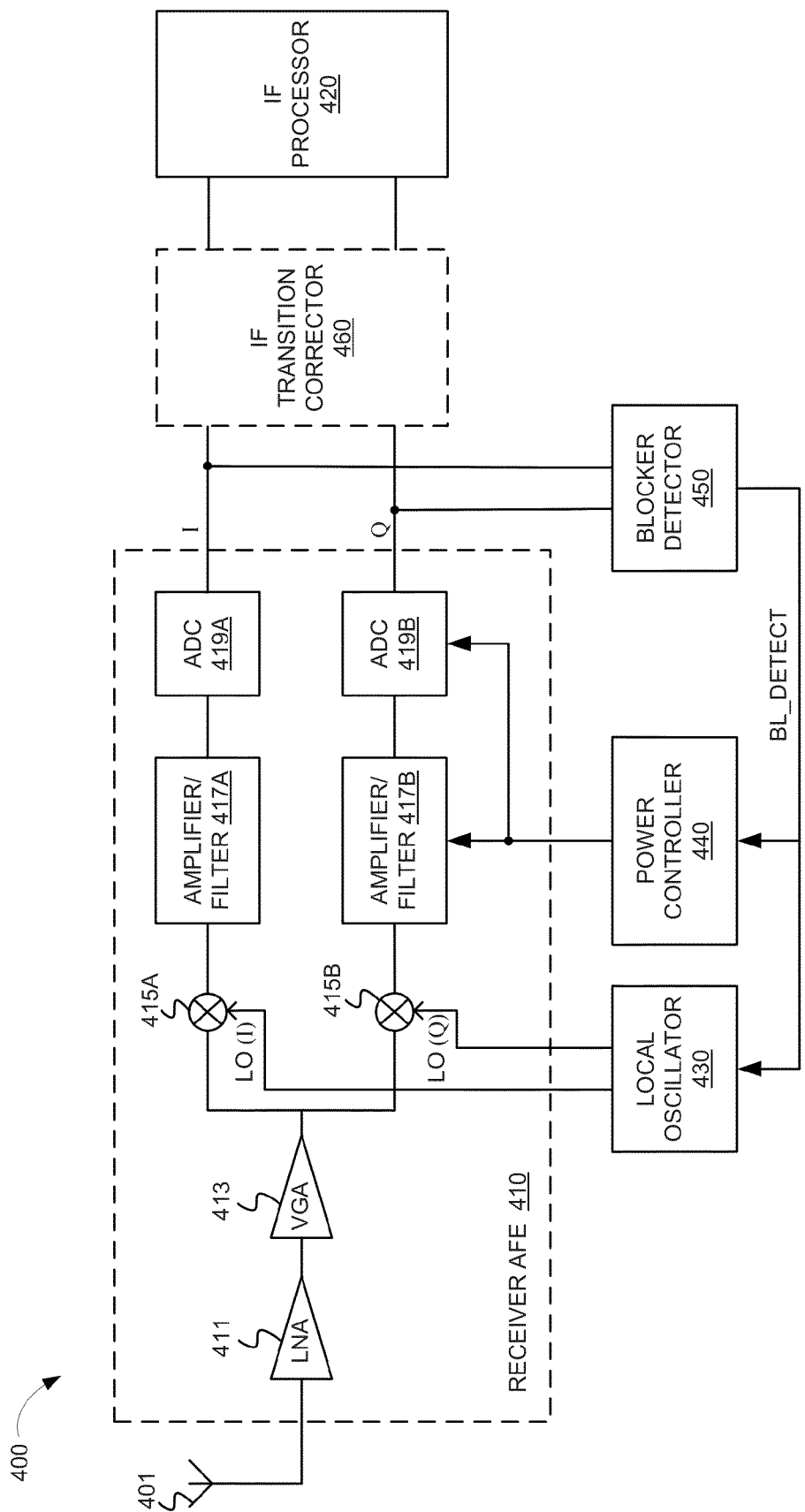
FIG. 4 is a block diagram of a heterodyne receiver having a dynamic IF in accordance with some embodiments.

FIG. 4 is a block diagram of a heterodyne receiver 400 having a dynamic IF in accordance with some embodiments. The receiver 400 may be included within a communication device such as a wireless (e.g., WLAN) device or a device with a wired network connection. In some embodiments, the receiver 400 includes an antenna 401, a receiver analog front end (AFE) 410, an IF processor 420, a local oscillator 430, a power controller 440, and a blocker detector 450.

The receiver AFE 410 includes a low-noise amplifier (LNA) 411, a variable gain amplifier (VGA) 413, a local oscillator (LO) mixer 415A for the I signal path, amplifier/filter circuitry 417A for the I signal path, an analog-to-digital converter (ADC) 419A for the I signal path, an LO mixer 415B for the Q signal path, amplifier/filter circuitry 417B for the Q signal path, and an ADC 419B for the Q signal path. The mixers 415A and 415B convert a received signal into intermediate frequency I and Q signals by mixing the received signal with local oscillator signals LO(I) and LO(Q) generated by the local oscillator 430. Mismatch between mixers 415A and 415B, between amplifiers/filters 417A and 417B, and/or between ADCs 268A and 268B results in receiver-side I/Q mismatch.

For some embodiments, the receiver 400 may be configured to implement a Bluetooth protocol. For example, the receiver 400 may receive a 2.4 GHz wireless signal with a signal strength of −90 dBm to 0 dBm. Certain Bluetooth protocols allow a receiver to communicate using a variety of options. Thus, for some embodiments, the receiver 400 may be configured to negotiate various transmission parameters (e.g., modulation schemes, transmission speeds, use of encryption, etc.). For such embodiments, the receiver 400 may perform different operations depending on the negotiated parameters. For example, the receiver 400 may be configured to receive wireless signals that are transmitted at 1 Mbps (e.g., using GFSK modulation), 2 Mbps, and/or 3 Mbps (e.g., using π/4-DQPSK and 8-DPSK modulation). Specifically, the receiver 400 operates in Basic Rate (BR) mode when configured to receive data signals at 1 Mbps, and in Enhanced Data Rate (EDR) mode when configured to receive data signals at 2 or 3 Mbps. Each of these configurations may consume different amounts of power while providing different levels of performance.

The power controller 440 may dynamically control or regulate the power usage of the receiver 400, depending on the negotiated parameters. For some embodiments, the power controller 440 may selectively deactivate the quadrature (or in-phase) chain of the receiver AFE 410, thus operating in a "low power" mode, when the quality of the received data signal is sufficiently high. For example, the power controller 440 may deactivate the amplifier/filter 417B, the ADC 419B, and/or the mixer 415B based on channel state information. The channel state information may include information indicative of a received signal strength indication (RSSI), information indicative of a packet error rate (PER) for packets encoded on the wireless signal, and header error check (HEC) and/or cyclical redundancy check (CRC) errors for received data packets.

Various embodiments of the power controller 440 are further described in U.S. Pat. No. 8,279,974, entitled "Dynamic Power Reduction in a Wireless Receiver," which is incorporated herein by reference in its entirety.

Bluetooth EDR frames typically require an IF 727 kHz to be communicated properly when the receiver 400 operates in low power mode (i.e., using a single quadrature chain). Thus, the receiver 400 ideally operates at IF=727 kHz in order to take advantage of the ability to enter the low power mode. However, as described above with reference to FIG. 2A, the image of a −2 MHz blocker 202 may interfere with the received data signal 201 in the IF band, which impedes I/O mismatch calibration. Interference from a −2 MHz blocker image 203 may be mitigated (if not altogether eliminated) by moving IF closer to baseband (e.g., IF=500 kHz), as shown in FIG. 2B.

The blocker detector 450 receives the I and Q signals output by the receiver AFE 410 and detects the presence of a blocker image that interferes, or could potentially interfere, with the data signal in the IF band. For some embodiments, the blocker detector 450 may scan the frequency band(s) with image frequencies that are close in proximity to IF for the presence of a blocker (e.g., as described with respect to FIG. 7). If the detector 450 detects a blocker, the detector 450 may output (e.g., assert) a blocker detection (BL_DETECT) signal to the local oscillator 430 and the power controller 440.

Upon receiving the BL_DETECT signal, the local oscillator 430 may adjust the IF for the receiver 400 by changing the frequencies of the LO(I) and LO(Q) signals. For some embodiments, the local oscillator 430 may reduce IF (i.e., bring IF closer to baseband) to place the blocker image out of range of interference with the received data signal. For example, the local oscillator 430 may reduce IF (e.g., for a received RF signal) by increasing the frequencies of the LO(I) and LO(Q) signals. For some embodiments, the local oscillator 430 may increase IF (i.e., move IF further away from baseband) when BL_DETECT is de-asserted (e.g., indicating that no blocker was detected). For example, the local oscillator 430 may increase IF by decreasing the frequencies of the LO(I) and LO(Q) signals.

The power controller 440 may respond to the BL_DETECT signal by disabling the low power mode. For example, because the BL_DETECT signal causes the local oscillator 430 to reduce IF, the receiver 400 may be unable to properly receive Bluetooth EDR frames using a single quadrature chain (i.e., because IF<727 kHz). For some embodiments, the power controller 440 may ensure that both the I and Q chains of the receiver AFE 410 are active when BL_DETECT is asserted. For example, the power controller 440 may disable low power mode by activating (or reactivating) the mixer 415B, amplifier/filter 417B, and ADC 419B. For some embodiments, the power controller 440 may deactivate the Q (or I) chain when BL_DETECT is de-asserted, thereby placing the receiver 400 in low power mode. For example, the power controller 440 may place the receiver 400 in low power mode by deactivating the mixer 415B, amplifier/filter 417B, and/or ADC 419B.

Figure 5:
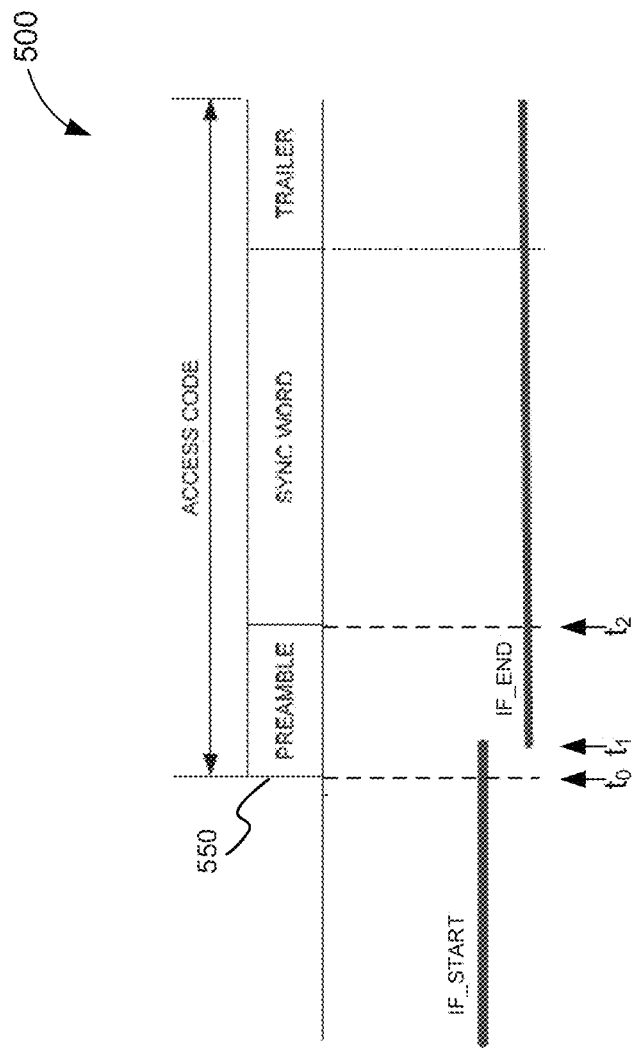
FIG. 5 is a timing diagram depicting a dynamic IF switching operation in accordance with some embodiments.

For some embodiments, the blocker detector 450 may be configured to detect blockers when the receiver 400 first begins to receive an incoming data packet. For example, with reference to the timing diagram 500 of FIG. 5, the receiver 400 is initially configured for IF =IF_START (e.g., 727 kHz) prior to receiving a data packet 550. The blocker detector 450 may begin searching for blockers (and/or blocker images) that might interfere with the current IF as soon as the receiver 400 receives the preamble of the data packet 550 (time $t_0$). Upon detecting a blocker (time $t_1$), the blocker detector 450 may cause the local oscillator 430 to reduce IF to IF =IF_END (e.g., 500 kHz) by asserting the BL_DETECT signal. In this example, IF is reduced to IF_END prior to initial data acquisition (time $t_2$). Note, however, that this largely depends on the settling time of the frequency synthesizer used in the local oscillator 430. Thus, for some embodiments, the local oscillator 430 may successfully transition IF to a new frequency before any relevant data is received (e.g., while the receiver 400 is still receiving the preamble of the data packet 550). However, in other embodiments, the IF transition may be much slower (e.g., where the local oscillator 430 has a settling time >1 μs), and may even extend beyond the preamble period (time $t_0$-$t_2$).

Figure 6A:
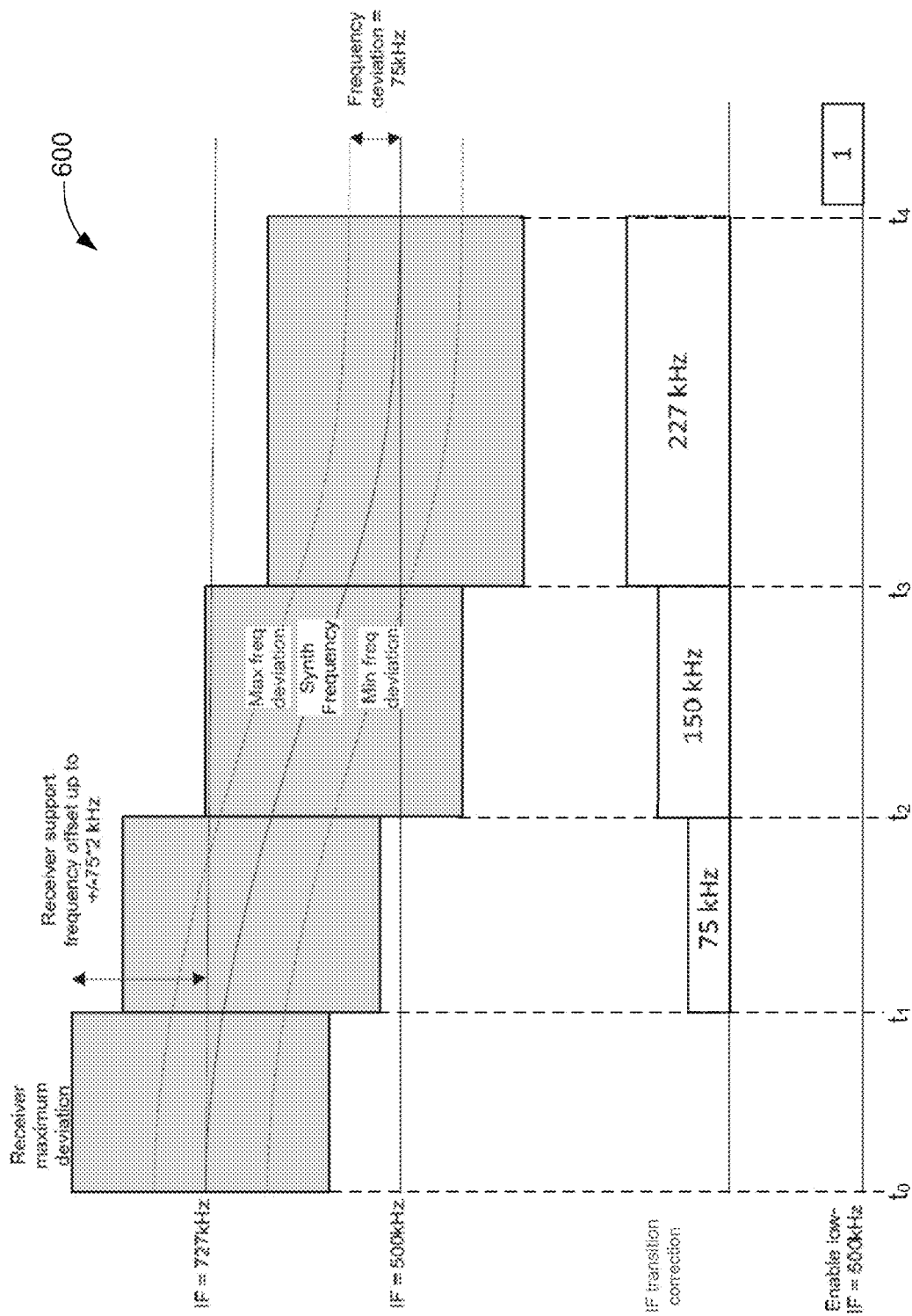
FIGS. 6A-6B are timing diagrams depicting a dynamic IF switching operation in accordance with other embodiments.

For some embodiments, the receiver 400 may include an IF transition corrector 460 that increases the loop bandwidth of received data signal (e.g., in discrete steps) to support frequency offsets greater than those supported by the digital components of the receiver 400. For example, the Bluetooth specification allows for a maximum drift rate of 400 Hz/μs. As shown with respect to the timing diagram 600 of FIG. 6A, the local oscillator 430 may have a relatively slow settling time (time $t_0$-$t_4$), whereas the digital components of the receiver 400 may only be able to tolerate a maximum frequency offset of 75*2=150 kHz. Therefore, as IF transitions from 727 kHz to 500 kHz (time $t_1$-$t_4$), the frequency of the received data signal may deviate beyond the maximum supported bandwidth of the digital circuitry in the receiver 400 (e.g., the IF processor 420).

The IF transition corrector 460 may incrementally adjust the bandwidth of the digital data signal over the settling period (time $t_0$-$t_4$) to ensure that no received data is lost while the local oscillator 430 adjusts IF (e.g., from 727 kHz to 500 kHz). Referring again to the example shown in FIG. 6A, when the local oscillator 430 first begins to adjust IF (time $t_0$-$t_1$), the synthesizer frequency (i.e., the frequency of LO(I) and LO(Q)) is well within the 727 kHz frequency band supported by the receiver 400 (taking into account the maximum and minimum frequency deviations). Therefore, the IF transition corrector 460 does not apply a frequency offset during this initial period (time $t_0$-$t_1$). As the IF transition progresses (time $t_1$-$t_2$), the synthesizer frequency begins to deviate beyond the maximum supported frequency of the receiver 400. The IF transition corrector 460 may therefore apply a 75 kHz frequency offset to the sampled data signal to account for this drift in frequency (time $t_1$-$t_2$). The IF transition corrector 460 may further apply a 150 kHz offset (time $t_2$-$t_3$) and a 227 kHz offset (time $t_3$-$t_4$) to maintain the frequency of the sampled data within the operating frequency range (e.g., 727 kHz±150 kHz) of the receiver 400 as the synthesizer frequency deviates further towards 500 kHz (time $t_2$-$t_4$). When IF finally settles at 500 kHz (time $t_4$), the operating frequency of the receiver 400 switches over to 500 kHz (e.g., from 727 kHz) and the IF transition corrector 460 may be deactivated.

Figure 6B:
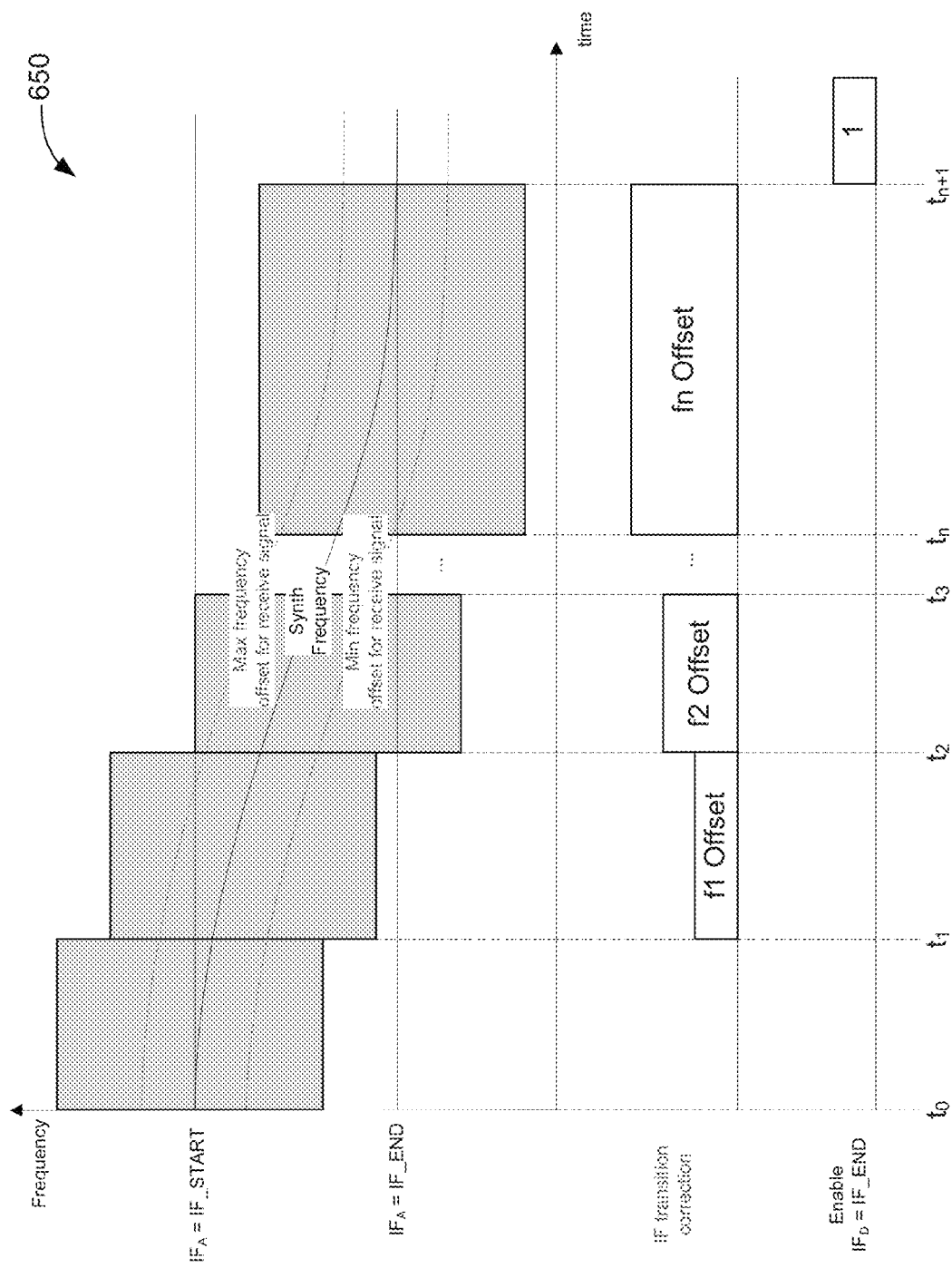

For some embodiments, the IF transition corrector 460 may be configured to track the IF transition in discrete steps (e.g., times $t_0$-$t_1$, $t_1$-$t_2$, $t_2$-$t_3$, and $t_3$-$t_4$). Each of these steps, and their associated frequency offsets, may be configured based on the settling time of the local oscillator 430 and/or the degree by which IF is adjusted. For example, the timing diagram 650 of FIG. 6B shows a more generic application of the IF transition corrector 460, wherein the analog IF ($IF_A$) is adjusted from $IF_A$=IF_START to $IF_A$=IF_END over a settling period (time $t_0$-$t_{n+1}$). The digital components of the receiver 400 may be configured to operate at the starting IF (e.g., $IF_D$=IF_START) for the duration that the analog IF is transitioning from $IF_A$=IF_START to $IF_A$=IF_END (time $t_0$-$t_{n+1}$). Accordingly, the IF transition corrector 460 may incrementally offset the frequency (e.g., f1-fn offset, where f1<f2<fn≤ (IF_END−IF_START)) of a received digital data signal over n number of discrete steps (e.g., times $t_0$-$t_1$, $t_1$-$t_2$, $t_2$-$t_3$, . . . , $t_n$-$t_{n+1}$).

The components described with reference to FIG. 4 are exemplary only. In various embodiments, one or more of the components described may be omitted, combined, or modified, and additional components may be included. For instance, in some embodiments, the receiver 400 may have various additional antennas and/or receiver chains. In other embodiments, there may be no antenna; instead, the receiver 400 may be connected to a wired link. In some implementations, the receiver 400 may include less or more filter and/or amplifier circuitry (e.g., filters 417A and 417B of FIG. 4).

Figure 7:
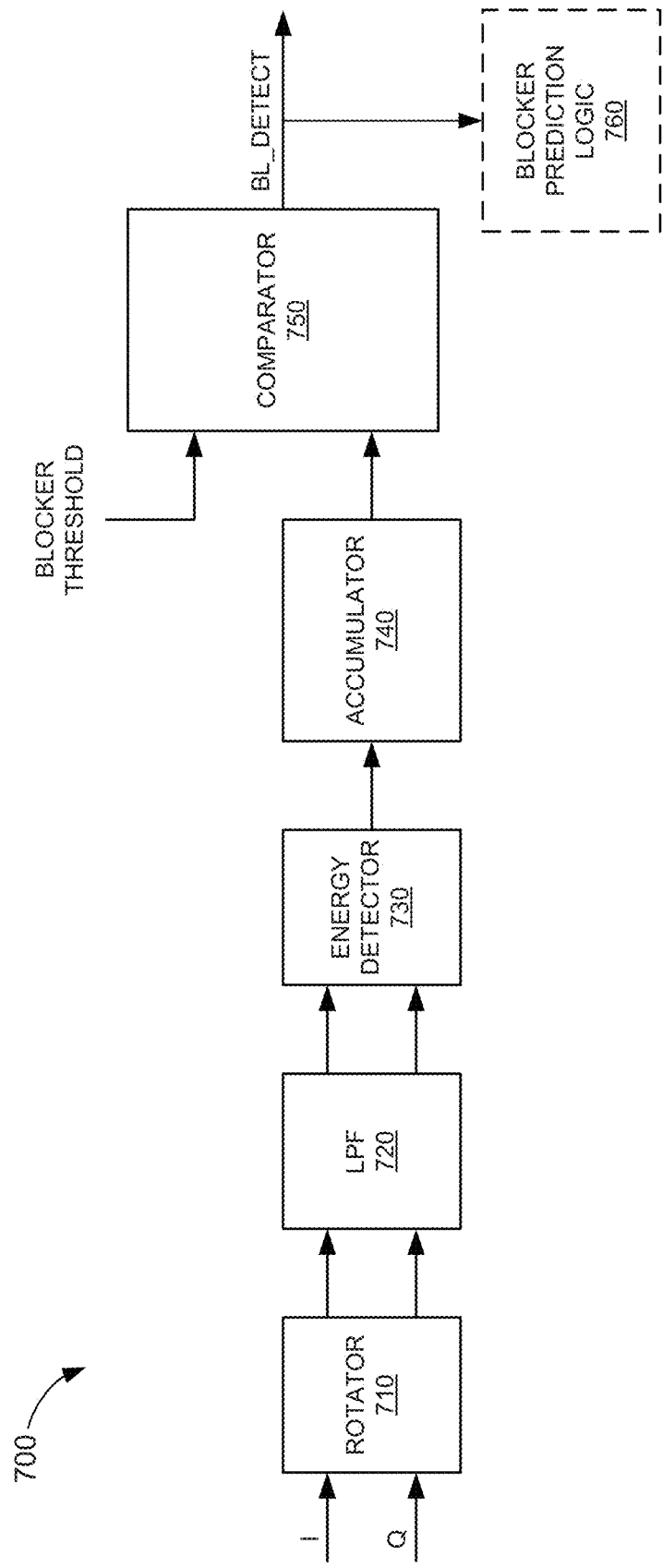
FIG. 7 is a block diagram of a blocker detector in accordance with some embodiments.

FIG. 7 is a block diagram of a blocker detector 700 in accordance with some embodiments. The blocker detector 700 may be implemented, for example, as blocker detector 450 in FIG. 4. Thus, the blocker detector 700 may receive the sampled I and Q signals from the receiver AFE 410 and determine whether a blocker (and/or blocker image) interferes with the received data signal. For some embodiments, the blocker detector 700 includes a rotator 710, a low-pass filter (LPF) 720, an energy detector 730, an accumulator 740, and a comparator 750.

The rotator 710 shifts the frequency of the received data signal so that a blocker can be easily detected. For some embodiments, the rotator 710 may shift the frequency of the received data signal so that the blocker (if present) is centered at baseband. For example, with reference to FIG. 2A, the rotator 710 may shift the frequency of the received data signal by +1.273 MHz, and with reference to FIG. 2B, the rotator may shift the frequency of the received data signal by +1.5 MHz. Generally, for some embodiments, the rotator 710 may shift the frequency of the received data signal by +(IF−2 MHz).

The LPF 720 applies low-pass filtering to the frequency-shifted signal to isolate any blocker that may be present. For some embodiments, the LPF 720 may implement a narrow-band low-pass filter. For example, the blocker detector 700 may be configured to only detect blockers that could potentially interfere with the received data signal. Therefore, only blocker images (or portions thereof) which could potentially fall within the IF band are of interest to the detector 700. The LPF 720 may be substituted for a bandpass filter in one or more alternative embodiments.

The energy detector 730 measures the energy in the filtered signal. Specifically, the energy detector 730 may be used to detect the presence of blockers (and/or other noise) at the blocker frequency (e.g., IF−2 MHz) by measuring the energy of the filtered signal. For some embodiments, the energy detector 730 may determine the energy of the filtered signal by calculating the area under the frequency curve (i.e., sqrt $[I^2+Q^2]$). The accumulator 740 sums the detected energy over a period of time (e.g., for a number of data samples) and outputs the accumulated energy to the comparator 750.

The comparator 750 compares the energy of the filtered signal, as determined by energy detector 730, with a blocker threshold energy value to determine whether a blocker (if present) would substantially interfere with a received data signal. The comparator 750 selectively asserts (or de-asserts) the BL_DETECT signal depending on the comparison. For example, the comparator 750 may assert the BL_DETECT signal when the detected energy is greater than or equal to the blocker threshold. Otherwise, the BL_DETECT signal may remain de-asserted. For some embodiments, the blocker detector 700 may assert the BL_DETECT signal only if the blocker interference is relatively strong (e.g., equal or greater in power) compared to the received data signal. Thus, the blocker threshold may be configured based on the power (or expected power) of the received data signal.

For some embodiments, the BL_DETECT signal may be further provided to a blocker prediction logic 760. For example, the receiver 400 of FIG. 4 may implement an adaptive frequency-hopping (AFH) algorithm. In accordance with the AFH algorithm, a wireless signal pseudo-randomly changes carrier frequencies at regular intervals to avoid interference from a stationary blocker (e.g., a WLAN). However, if a blocker is detected when the receiver 400 first hops to a particular channel, the blocker is likely to still be present on that channel after one or more cycles. The blocker prediction logic 760 may therefore associate blockers with the channels on which they are detected in order to predict the presence of a blocker.

Figure 8A:
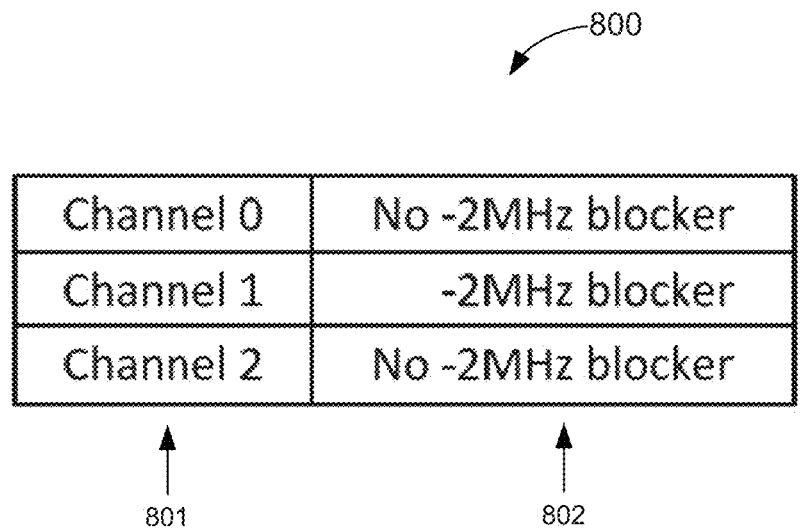
FIGS. 8A-8B show exemplary data structures which may be used for predicting the presence of blockers on one or more communications channels, in accordance with some embodiments.

For some embodiments, the blocker prediction logic 760 may include a memory for storing a data structure, such as data structure 800 shown in FIG. 8A. The data structure 800 includes a first column 801 for storing one or more communications channels and a second column 802 for storing information indicating whether a blocker was detected on the corresponding channel. For example, the blocker information may be stored as a single bit of data (e.g., 1 or 0) indicating whether a blocker was detected. For some embodiments, the data structure 800 may be periodically updated (e.g., reset) to ensure that the blocker information is still accurate.

Figure 8B:
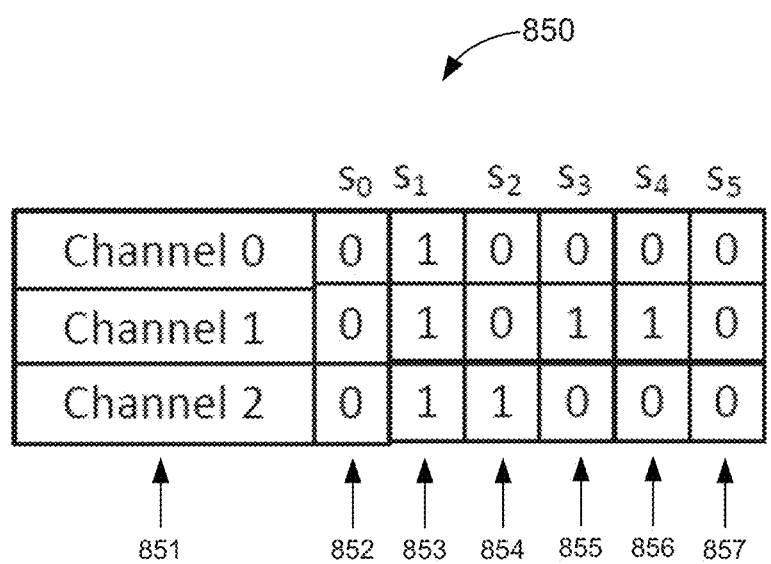

For other embodiments, the blocker prediction logic 760 may implement a different data structure, such as data structure 850 shown in FIG. 8B. The data structure 850 includes a first column 851 for storing one or more wireless communications channels, and a number of additional columns (852-857) for storing blocker information bits over a plurality of hops. For example, the first time the receiver 400 hops to channel 0, the receiver 400 may record whether or not a blocker was detected in the corresponding row of column 852; the second time the receiver 400 hops to channel 0, the receiver 400 may record whether or not a blocker was detected in the corresponding row of column 853; etc. The same process may be performed for each of the different communications channels. The prediction as to whether a channel contains a blocker may be based on a moving average of the blocker information in columns 852-857. For example, the blocker prediction logic 760 may predict that a blocker is present on a given channel if the sum of the blocker information bits associated with that channel is greater than (or equal to) a threshold value. Moreover, this implementation allows the blocker prediction logic 760 to determine when a blocker disappears from a channel.

When the receiver 400 is about to hop to a particular wireless channel, it may first check the blocker prediction logic 760 to determine whether a blocker is predicted to be present on that channel. For some embodiments, the receiver 400 may avoid channels that are predicted to have blockers. For other embodiments, the receiver 400 may periodically hop to a channel predicted to have a blocker to verify whether the blocker is still present on that channel (e.g., and also to verify the accuracy of information stored in table 850).

The data structures 800 and 850 have been described herein for exemplary purposes only. It should be noted that the blocker prediction logic 760 may store channel information of fewer or more channels than shown in FIGS. 8A-8B. For some embodiments, the blocker prediction logic 760 may predict the presence of a blocker based on information from the received data signal (e.g., in lieu of the BL_DETECT signal). For example, the blocker prediction logic 760 could predict that a blocker is present if the RSSI value is strong (e.g., >−80 dBm) and (i) the packet error is erroneous, or (ii) the CRC fails.

Figure 9:
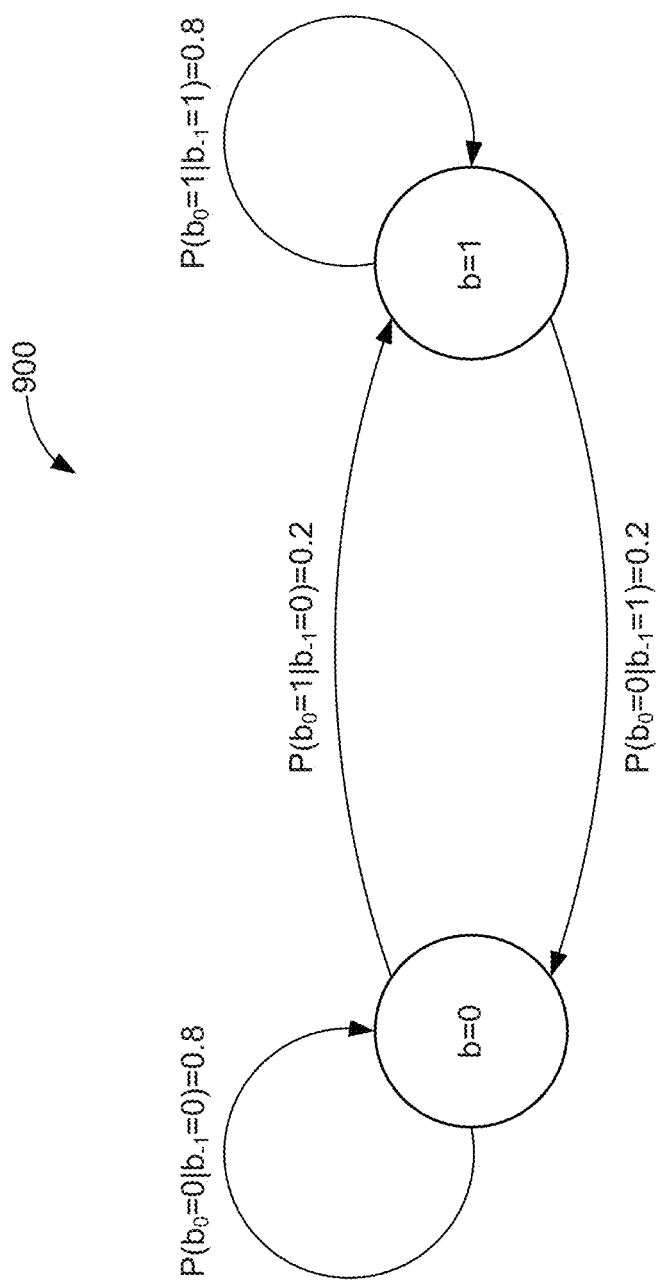
FIG. 9 shows an exemplary Markov chain that may be used for predicting the presence of blockers in accordance with some embodiments.

FIG. 9 shows an exemplary Markov chain 900 that may be used for predicting the presence of blockers in accordance with some embodiments. As described above, the blocker prediction logic 760 may use historical data to determine whether a blocker is currently present on a particular channel (or set of channels). For some embodiments, the blocker prediction logic 760 may perform the prediction based on a Markov process. For example, the Markov chain 900 includes two states: "b=0," denoting that a blocker is/was present on the channel; and "b=1," denoting that no blocker is/was present on the channel. More specifically, $b_0$ represents the current status of the blocker (i.e., whether or not a blocker is currently present) and $b_1$ represents the past status of the blocker (i.e., whether or not a blocker was previously detected).

With respect to the exemplary Markov chain 900, it may first be assumed that there is a 50-50 probability that a blocker was previously detected on a given channel (i.e., $P(b_{-1}=0)=P(b_{-1}=1)=0.5$). If a blocker was previously detected on the channel, there is an 80% chance that a blocker is currently present on the channel (i.e., $P(b_0=1|b_{-1}=1)=0.8$) and a 20% chance that no blocker is currently present on the channel (i.e., $P(b_0=0|b_{-1}=1)=0.2$). If no blocker was previously detected on the channel, there is a 20% chance that a blocker is currently present on the channel (i.e., $P(b_0=1|b_{-1}=0)=0.2$) and an 80% chance that no blocker is currently present on the channel (i.e., $P(b_0=0|b_{-1}=0)=0.8$). For some embodiments, the blocker prediction logic 760 may predict whether or not a blocker is currently present on the channel based on whether the indicated probability exceeds a threshold probability $T_P$ (i.e., $P(b_0=1|b_{-1}=d_{-1})>T_P$, where $d_{-1}$ represents the past determination recorded).

It should be noted that the probabilities given to each state transition in the Markov chain 900 are for exemplary purposes only. Furthermore, in other embodiments, the blocker prediction logic 760 may predict whether or not a blocker is currently present based on multiple past determinations (e.g., $P(b_0=1|b_{-1}=d_{-1}, b_{-2}=d_{-2})>T_P$, where $d_{-1}$ represents the determination recorded from a previous prediction cycle and $d_{-2}$ represents the determination recorded from two prediction cycles earlier). For example, in at least some embodiments, the multiple past determinations may be found from past data, through channel simulation models, or a combination of both.

Figure 10:
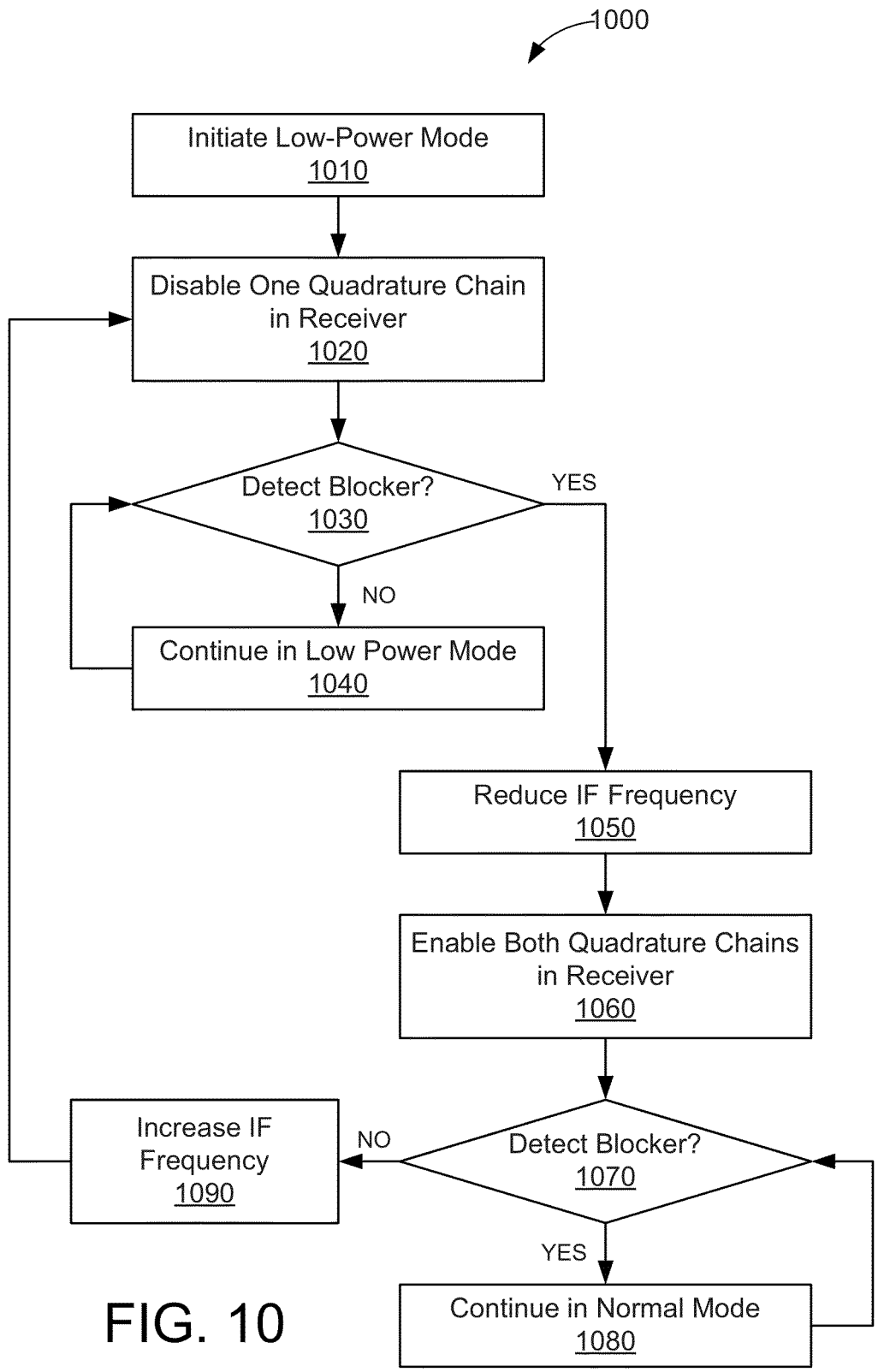
FIG. 10 is an illustrative flow chart depicting a more detailed embodiment of a dynamic IF adjustment operation.

FIG. 10 is an illustrative flow chart depicting a more detailed embodiment of a dynamic IF adjustment operation 1000. With reference, for example, to FIG. 4, the receiver 400 is initially placed in a low power mode (1010). For some embodiments, the power controller 440 may dynamically control or regulate the power usage of the receiver 400, depending on the wireless communications parameters. While in operating in low power mode, the receiver IF may be 727 kHz.

The receiver 400 then disables one of the quadrature chains (I or Q) in the receiver AFE 410 (1020). For example, the power controller 440 may disable the Q chain by deactivating the amplifier/filter 4178, the ADC 4198, and/or the mixer 4158.

While operating in the low power mode, the receiver 400 determines whether a blocker image interferes (or could potentially interfere) with a received data signal in the IF band (1030). For some embodiments, the blocker detector 450 may scan the frequency band(s) which have image frequencies that are relatively close in proximity to IF for the presence of a blocker (e.g., as described with respect to FIG. 5). If the receiver 400 implements AFH techniques, the blocker detector 450 may query the blocker prediction logic 760 (e.g., as described with respect to FIG. 7) to determine whether a blocker is predicted to be present on a particular channel.

For some embodiments, the blocker detection process (1030) is periodically repeated. As long as no blocker (i.e., interfering blocker image) is detected, the receiver 400 may continue to operate in the low power mode (1040).

Upon detecting a blocker (1030), the receiver may reduce IF to a level where the blocker image is out of range of interference with the received data signal (1050). For example, if the detector 450 detects a blocker, the detector 450 may assert the BL_DETECT signal. The local oscillator 430 may respond to the asserted BL_DETECT signal by changing the frequencies of the LO(I) and LO(Q) signals. For some embodiments, the local oscillator 430 may reduce IF by increasing the frequencies of LO(I) and LO(Q).

The receiver 400 then enables both (I and Q) quadrature chains in the receiver AFE 410 (1060). For example, the power controller 440 may respond to the BL_DETECT signal by activating (or reactivating) the mixer 415B, amplifier/filter 417B, and ADC 419B. This effectively takes the receiver 400 out of low power mode, and places the receiver 400 in a normal operating mode.

While operating in the normal mode, the receiver 400 determines whether a blocker image interferes (or could potentially interfere) with a received data signal in the IF band (1070). As described above, the blocker detector 450 may scan the frequency band(s) which have image frequencies that are relatively close in proximity to IF for the presence of a blocker. If the receiver 400 implements AFH techniques, the blocker detector 450 may query the blocker prediction logic 760 to determine whether a blocker is predicted to be present on a particular channel.

For some embodiments, the blocker detection process (1070) is periodically repeated. As long as the blocker (i.e., interfering blocker image) is still present, the receiver 400 may continue to operate in the normal operating mode (1080).

If the blocker is no longer detected (1070), the receiver may increase IF to a level where one of the (I or Q) quadrature chains can be disabled without sacrificing data (1090). For example, if the detector 450 does not detect a blocker, the detector 450 may de-assert the BL_DETECT signal. The local oscillator 430 may respond to the de-asserted BL_DETECT signal by changing the frequencies of the LO(I) and LO(Q) signals. For some embodiments, the local oscillator 430 may increase IF by lowering the frequencies of LO(I) and LO(Q).

The receiver 400 then disables one of the (I or Q) quadrature chains in the receiver AFE 410 (1020). For example, the power controller 440 may disable the Q chain by deactivating the amplifier/filter 417B, the ADC 419B, and/or the mixer 415B. This effectively places the receiver 400 back in the low power mode.

The foregoing processes (1020-1090) may be continuously repeated for the duration of a data communications operation. By selectively adjusting the IF band of the receiver 400 based on the presence of blockers, the dynamic IF adjustment operation 1000 may substantially reduce (and potentially eliminate) blocker image interference caused by down-converting a received data signal to IF. In addition, the operation 1000 allows the receiver 400 to selectively enter a low power mode, depending on the presence (and/or absence) of blockers, without risk of losing data.

Figure 11:
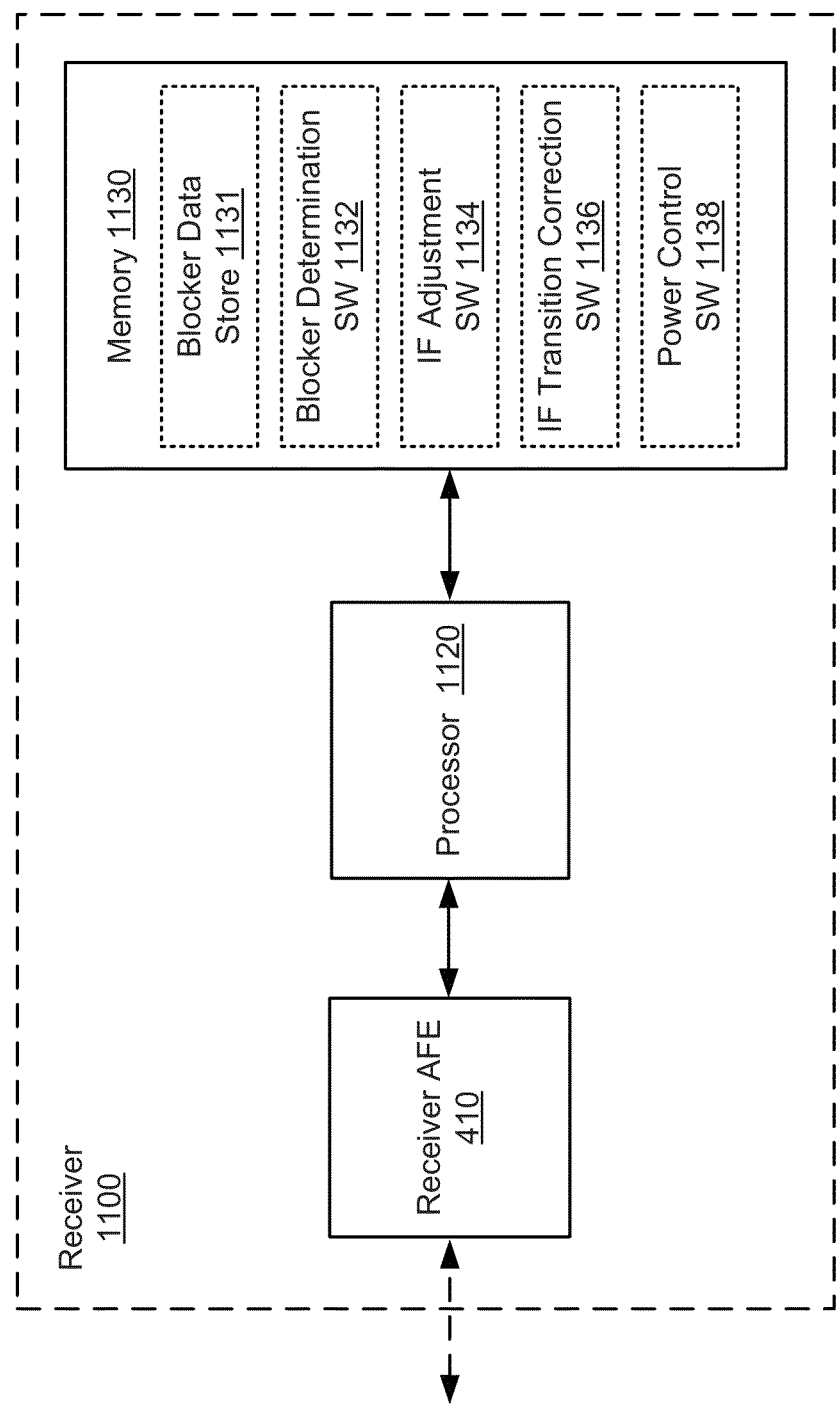
FIG. 11 is another block diagram of a heterodyne receiver having a dynamic IF in accordance with some embodiments.

FIG. 11 is another block diagram of a heterodyne receiver 1100 having a dynamic IF in accordance with some embodiments. The receiver 1100 includes receiver AFE 410, a processor 1120, and a memory 1130. As described above, the receiver AFE 410 receives an RF signal and converts the received signal to an intermediate frequency. The memory 1130 may include a blocker data store 1131 that can be used to store blocker information indicating whether a blocker was detected (e.g., on a particular channel). For example, the blocker data store 1131 may store one or more of the data structures 800 and/or 850 described above, with respect to FIGS. 8A-8B.

Furthermore, memory 1130 may also include a non-transitory computer-readable storage medium that may store the following software modules:

- a blocker determination software module 1132 to detect and/or predict the presence of a blocker on a given communications channel;
- an IF adjustment software module 1134 to selectively adjust the intermediate frequency to which the received RF signal is converted depending on whether or not a blocker is present;
- an IF transition correction software module 1136 to apply one or more frequency offsets to the received data signal, in the digital domain, based on a settling time of a local oscillator used in converting the RF data signal to IF; and
- a power control software module 1138 to selectively deactivate a quadrature chain of the receiver AFE 410 depending on whether or not a blocker is present.

The software modules 1132-1138 include instructions that, when executed by processor 1120, may cause the receiver 1100 to perform the corresponding function(s). Thus, the non-transitory computer-readable storage medium of memory 1130 may include instructions for performing all or a portion of the operations described above.

Processor 1120, which is coupled to the receiver AFE 410 and memory 1130, may be any suitable processor capable of executing scripts of instructions of one or more software programs stored in the receiver 1100. For example, the processor 1120 may execute the blocker determination software module 1132 to determine whether a blocker is present on a communications channel that could cause interference with the received RF signal. For some embodiments, the blocker determination software module 1132 as executed by processor 1120 may scan the frequency bands that have image frequencies close in proximity to IF for the presence of a blocker (e.g., as described above with reference to FIG. 7). For other embodiments, the processor 1120, in executing the blocker determination software module 1132, may predict whether a blocker is likely to be present on a particular channel based on whether a blocker was previously detected on that channel (e.g., as described above with reference to FIGS. 7-9).

If a blocker is detected and/or predicted, the processor 1120 may execute the IF adjustment software module 1134 to adjust the intermediate frequency to which the RF signal is converted. More specifically, the IF adjustment software module 1134 as executed by the processor 1120 may either raise or lower the IF so that the blocker image does not overlap with the received data signal (e.g., as described above, with reference to FIGS. 2A-2B). For some embodiments, the processor 1120, in executing the IF adjustment software module 1134, may adjust the IF by changing the frequency of one or more local oscillator signals that are mixed with the RF signal. For example, the processor 1120 may lower the IF by increasing the frequency of the local oscillator signals. Alternatively, the processor 1120 may raise the IF by decreasing the frequency of the local oscillator signals.

The processor 1120 may subsequently execute the IF transition correction software module 1136 to incrementally adjust the bandwidth of the received data signal, in the digital domain, based on a settling time associated with adjusting the IF. As the frequency of the local oscillator signals are raised or lowered, the frequency of the received data signal may deviate beyond the maximum bandwidth supported by the digital circuitry (e.g., ADCs 419A and 419B of FIG. 4) at either the original IF or the new IF (e.g., IF_START and IF_END, respectively, as shown in FIG. 6B). Thus, for some embodiments, the processor 1120, in executing the IF transition correction software module 1136, may be configured to track the IF transition in a number discrete steps and thereby offset the frequency of the digital data signal over the total number of discrete steps (e.g., as described above with reference to FIGS. 6A-6B).

If no blocker is detected and/or predicted, the processor 1120 may execute the power control software module 1138 to deactivate one of the quadrature (I or Q) chains of the receiver AFE 410. As described above, with reference to FIG. 4, deactivating the I quadrature chain (which includes mixer 415A, amplifier/filter 417A, and ADC 419A) or the Q quadrature chain (which includes mixer 415B, amplifier/filter 417B, and ADC 419B) effectively places the receiver AFE 410 in a low power mode. However, if a blocker is detected and/or predicted, the processor 1120, in executing the power control software module 1138, may prevent the receiver AFE 410 from entering a low power mode (e.g., by ensuring that both quadrature chains are active).

In the foregoing specification, the present embodiments have been described with reference to specific exemplary embodiments thereof. It will, however, be evident that various modifications and changes may be made thereto without departing from the broader scope of the disclosure as set forth in the appended claims. The specification and drawings are, accordingly, to be regarded in an illustrative sense rather than a restrictive sense. For example, the method steps depicted in the flow charts of FIGS. 3 and 9 may be performed in other suitable orders and/or multiple steps may be combined into a single step. Although reference is made to specific IF bands (e.g., IF=727 kHz or 500 kHz), reference to such IF bands are used herein for purposes of illustration only. The systems and methods, described herein, for dynamically adjusting IF may be applied to any IF value.

What is claimed is:

1. A method of operating a receiver in a communications system, the method comprising:
   receiving a radio-frequency (RF) data signal;
   converting the RF data signal to an intermediate frequency;
   sampling the converted RF data signal to produce a digital data signal;
   selectively applying one or more frequency offsets to the digital data signal based, at least in part, on a settling time of a local oscillator used in converting the digital data signal to the intermediate frequency;
   determining whether a blocker image interferes with the RF data signal; and
   selectively adjusting the intermediate frequency to which the RF data signal is converted based on the determination.

2. The method of claim 1, wherein selectively adjusting the intermediate frequency comprises:
   lowering the intermediate frequency if the blocker image interferes with the digital data signal.

3. The method of claim 1, further comprising:
   selectively deactivating a quadrature chain of the receiver based on the determination.

4. The method of claim 3, wherein selectively adjusting the intermediate frequency comprises:
   deactivating the quadrature chain if the blocker image does not interfere with the digital data signal.

5. The method of claim 1, wherein determining whether the blocker image interferes with the digital data signal comprises:
   determining a presence of a blocker at a first frequency;
   wherein an image of the first frequency is within a threshold range of the intermediate frequency.

6. The method of claim 5, wherein determining the presence of the blocker includes detecting the blocker at the first frequency.

7. The method of claim 6, further comprising storing information identifying the blocker in a first table.

8. The method of claim 7, wherein determining whether the blocker image interferes with the digital data signal further includes looking up the blocker in the first table.

9. The method of claim 5, wherein determining the presence of the blocker includes predicting whether the blocker will be present at the first frequency.

10. The method of claim 5, wherein determining whether the blocker image interferes with the converted RF data signal includes determining whether a power of the blocker at the first frequency exceeds a first threshold.

11. The method of claim 10, wherein the first threshold is based on a power of the RF data signal.

12. A method of operating a receiver in a communications system, the method comprising:
   receiving a radio-frequency (RF) data signal;
   converting the RF data signal to an intermediate frequency;
   determining whether a blocker image interferes with the converted RF data signal; and
   selectively adjusting the intermediate frequency to which the RF data signal is converted based on the determination;
   wherein determining whether the blocker image interferes with the converted RF data signal comprises:
      determining a presence of a blocker at a first frequency;
      wherein an image of the first frequency is within a threshold range of the intermediate frequency;
      wherein determining the presence of the blocker includes predicting whether the blocker will be present at the first frequency, wherein the prediction is based on a Markov chain.

13. A non-transitory computer-readable storage medium containing program instructions that, when executed by a processor provided within a communications device, causes the device to:
   receive a radio-frequency (RF) data signal;
   convert the RF data signal to an intermediate frequency;
   sample the converted data signal to produce a digital data signal;
   selectively apply one or more frequency offsets to the digital data signal based, at least in part, on a settling time of a local oscillator used in converting the digital data signal to the intermediate frequency;
   determine whether a blocker image interferes with the RF data signal; and
   selectively adjust the intermediate frequency to which the RF data signal is converted based on the determination.

14. The non-transitory computer-readable storage medium of claim 13, wherein execution of the program instructions to selectively adjust the intermediate frequency causes the device to:
   lower the intermediate frequency if the blocker image interferes with the digital data signal.

15. The non-transitory volatile computer-readable storage medium of claim 13, further comprising program instructions that cause the device to:
   selectively deactivate a quadrature chain of the receiver based on the determination.

16. The non-transitory computer-readable storage medium of claim 15, wherein execution of the program instructions to selectively adjust the intermediate frequency causes the device to:
   deactivate the quadrature chain if the blocker image does not interfere with the digital data signal.

17. The non-transitory computer-readable storage medium of claim 13, wherein execution of the program instructions to determine whether the blocker image interferes with the digital data signal causes the device to:
  determine a presence of a blocker at a first frequency;
  wherein an image of the first frequency is within a threshold range of the intermediate frequency.

18. The non-transitory computer-readable storage medium of claim 17, wherein execution of the program instructions to determine the presence of the blocker causes the device to:
  detect the blocker at the first frequency.

19. The non-transitory computer-readable storage medium of claim 18, further comprising program instructions that cause the device to:
  store information identifying the blocker in a first table.

20. The non-transitory computer-readable storage medium of claim 19, wherein execution of the program instructions to determine whether the blocker image interferes with the digital data signal further causes the device to:
  look up the blocker in the first table.

21. The non-transitory computer-readable storage medium of claim 17, wherein execution of the program instructions to determine the presence of the blocker causes the device to:
  predict whether the blocker will be present at the first frequency.

22. The non-transitory computer-readable storage medium of claim 21, wherein the prediction is based on a Markov chain.

23. The non-transitory computer-readable storage medium of claim 17, wherein execution of the program instructions to determine whether the blocker image interferes with the digital data signal further causes the device to:
  determine whether a power of the blocker at the first frequency exceeds a first threshold.

24. The non-transitory computer-readable storage medium of claim 23, wherein the first threshold is based on a power of the RF data signal.

25. A communications device, comprising:
  a receiver analog front end (AFE) to receive an RF data signal and convert the RF data signal to an intermediate frequency;
  a blocker detector to determine whether a blocker image interferes with the converted RF data signal;
  a local oscillator coupled between the blocker detector and the receiver AFE to selectively adjust the intermediate frequency to which the RF data signal is converted based on the determination; and
  a power controller coupled between the blocker detector and the receiver AFE to selectively deactivate a quadrature chain of the receiver AFE based on the determination.

26. The device of claim 25, wherein the local oscillator is configured to lower the intermediate frequency if the blocker image interferes with the converted RF data signal.

27. The device of claim 25, wherein the power controller is configured to deactivate the quadrature chain if the blocker image interferes with the converted RF data signal.

28. The device of claim 25, wherein the converted RF data signal corresponds to a digital data signal.

29. The device of claim 25, further comprising:
  a transition corrector to selectively apply one or more frequency offsets to the converted RF data signal based, at least in part, on a settling time of the local oscillator.

30. The device of claim 29, wherein the blocker detector determines the presence of the blocker by detecting the blocker at the first frequency.

31. The device of claim 29, wherein the blocker detector is determines the presence of the blocker by predicting whether the blocker will be present at the first frequency.

32. The device of claim 29, wherein the transition corrector is configured to compare the settling time of the local oscillator to a threshold settling time and apply the one or more frequency offsets to the converted RF data signal if the settling time of the local oscillator exceeds the threshold settling time.

33. The device of claim 32, wherein the blocker detector is further configured to store information identifying the blocker in a first table.

34. The device of claim 33, wherein the blocker detector determines whether the blocker image interferes with the converted RF data signal by looking up the blocker in the first table.

35. The device of claim 33, wherein the prediction is based on a Markov chain.

36. The device of claim 25, wherein the blocker detector is configured to determine a presence of a blocker at a first frequency, wherein an image of the first frequency is within a threshold range of the intermediate frequency.

37. A communication device, comprising:
  means for receiving a radio-frequency (RF) data signal;
  means for converting the RF data signal to an intermediate frequency;
  means for sampling the converted RF data signal to produce a digital data signal;
  means for selectively applying one or more frequency offsets to the digital data signal based, at least in part, on a settling time of a local oscillator used in converting the RF data signal to the intermediate frequency;
  means for determining whether a blocker image interferes with the digital data signal; and
  means for selectively adjusting the intermediate frequency to which the data signal is converted based on the determination.

* * * * *